(12) United States Patent
Ito et al.

(10) Patent No.: US 6,407,561 B1
(45) Date of Patent: Jun. 18, 2002

(54) PROBE FOR ELECTRO-OPTIC SAMPLING OSCILLOSCOPE

(75) Inventors: Akishige Ito; Katsushi Ohta; Toshiyuki Yagi, all of Tokyo; Mitsuru Shinagawa, Isehara; Tadao Nagatsuma, Sagamihara; Junzo Yamada, Ebina, all of (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/578,963

(22) Filed: May 25, 2000

(30) Foreign Application Priority Data

May 31, 1999 (JP) .......................................... 11-153073
Sep. 28, 1999 (JP) .......................................... 11-275388

(51) Int. Cl.⁷ ........................ G01R 31/308; G01R 31/02
(52) U.S. Cl. ........................ 324/753; 324/752; 324/760
(58) Field of Search ................... 324/753, 752, 324/760, 96, 76.36; 250/310, 339.03

(56) References Cited

U.S. PATENT DOCUMENTS

| | | | |
|---|---|---|---|
| 3,705,310 A | * 12/1972 | Wild | ................... 250/229 |
| 4,002,975 A | 1/1977 | Erickson et al. | |
| 4,873,485 A | * 10/1989 | Williamson | .................. 324/96 |
| 5,808,473 A | * 9/1998 | Shinagawa et al. | .......... 324/753 |
| 6,215,295 B1 | * 4/2001 | Smith, III | ................... 324/95 |

FOREIGN PATENT DOCUMENTS

| | | | |
|---|---|---|---|
| DE | 197 16 477 A1 | * 9/1998 | ................ 324/753 |
| GB | 2164145 | 3/1986 | |
| GB | 2342159 | 4/2000 | |
| GB | 2346446 | 8/2000 | |
| JP | 11174089 | 7/1999 | |

* cited by examiner

Primary Examiner—N. Le
Assistant Examiner—Anjan Deb
(74) Attorney, Agent, or Firm—Darby & Darby

(57) ABSTRACT

A probe for an electro-optic sampling oscilloscope is provided, capable of obtaining an improved accuracy in measurement of the test measuring signals by controlling a temperature of an electro-optic element so as to be maintained at a constant such that the refractive index of the electro-optic element does not change due to the temperature change. The probe for the electro-optic sampling oscilloscope comprises a reflecting film at one end and a metal pin provided on the surface of the reflecting film such that the optical property of the electro-optic film changes according to an electric field applied through the metal pin. The probe further comprises a temperature detecting portion, disposed so as to contact with the electro-optic element, for detecting and outputting the temperature of the electro-optic element, a temperature adjusting portion, disposed so as to contact with the electro-optic element facing the temperature detecting portion about the electro-optic element, and a temperature controlling portion for controlling the temperature adjusting portion based on the result of the temperature detection.

6 Claims, 2 Drawing Sheets

PROBE FOR ELECTRO-OPTIC SAMPLING OSCILLOSCOPE

BACKGROUND OF THE INVENTION

1. Field of the Invention

The present invention relates to an electro-optic probe, which is used for observing the waveforms of a test signal based on a change in the polarization state of a light pulse caused when the light pulse generated by a timing signal is input into an electro-optic crystal which is coupled with an electric field generated by the test measuring signal, and particularly relates to an improved probe for electro-optic sampling oscilloscope.

2. Background Art

An electro-optic probe is capable of observing waveforms of a test signal based on a change in the polarization state of a laser light caused when the light pulse generated by a timing signal is input into an electro-optic crystal which is coupled with an electric field generated by the test measuring signal. When the laser light is emitted in a pulsed mode, and when the test signal is used after sampling, a measurement can be executed that has a very high time resolution. An electro-optic sampling oscilloscope using an electro-optic probe is developed based on the above phenomenon.

The electro-optic sampling oscilloscope (hereinafter, called EOS oscilloscope) has following advantages over the conventional sampling oscilloscope using electric probes:

(1) Measurement is easy, because the ground line is not necessary during measurement.

(2) Since the metal pin disposed at the distal end of the electro-optic probe is insulated from the measuring circuit, a high input impedance is provided, which results in eliminating factors that disturb the conditions of the test point.

(3) The use of the light pulse allows carrying out wide band measurement reaching to the GHz order.

The structure of the conventional electro-optic probe used in the measurement of signals by the EOS oscilloscope will be described with reference to FIG. 2. The reference numeral 1 denotes a probe head made of an insulator and a metal pin 1a is inserted in the probe head 1. The reference numeral 2 denotes an electro-optic element, and a reflecting film 2a is formed on one end surface of the electro-optic element which the metal pin 1a contacts. The reference numeral 5 denotes a quarter-wave plate. The numerals 6 and 8 denote polarization beam splitters. The numeral 7 denotes a Faraday element. The numeral 9 denotes a collimating lens, and the numeral 10 denotes a laser diode which emits laser light in accordance with pulse signals.

The numerals 11 and 13 denote condenser lenses, and 12 and 14 denote photodiodes which output electric signals to the EOS oscilloscope after converting the input laser beam into electric signals. The numeral 15 denotes the probe body. The numeral 17 denotes an isolator constituted by the quarter-wave plate 5, two polarization beam splitters 6 and 8, and the Faraday element 7. The isolator is used for transmitting the output light from the laser diode 11, and for separating the reflected light by the reflecting film 2a.

Next, the optical path of the laser light emitted from the laser diode 10 will be described with reference to FIG. 2. The path of the laser light is represented by the reference symbol A.

The laser beam emitted from the laser diode 10 is converted into a parallel beam by the collimating lens 9, and input into the electro-optic element 2, after rectilinearly advancing through the polarization beam splitter 8, the Faraday element 7, and the polarizing beam splitter 6, and further passing the quarter-wave plate 5. The light beam input into the electro-optic element 2 is reflected by the reflecting film 2a formed at the end surface of the electro-optic element 2 facing to the metal pin 1a.

The reflected laser beam passes the quarter-wave plate 5, and a part of the laser light beam enters the photodiode 12 after being reflected by the polarized beam splitter 6 and being condensed by the condenser lens 11. The laser beam, which passes the polarizing beam splitter 6, enters into the photodiode 14, after being reflected by the polarization beam splitter 8 and condensed by the condenser lens 13.

The quarter-wave plate is used for adjusting intensities of two laser beams entering into two photodiodes 12 and 14 becomes identical.

Hereinafter, the operation of measurement by the use of the electro-optic probe shown in FIG. 2 is described.

When the metal pin 1a contacts with a measuring point, a voltage is generated at the metal pin 1a and the voltage propagates to the electro-optic element 2, which results in causing a change of the refractive index of the electro-optic element due to the Pockels effect. After the optical property of the electro-optic element changes, and when the laser beam emitted by the laser diode 10 enters and propagates through the electro-optic element, the polarization state of the electro-optic element changes. The laser beam having the thus changed polarization state is, after being reflected by the reflecting 2a, condensed and enters into the photodiodes 12 and 14 and is converted into electric signals.

The change of the voltage applied to the measuring point is reflected as the change of the polarization state of the laser light by the electro-optic element 2, and the change of the polarization state is detected by the difference between the output from the photodiodes 12 and 14. Thus, by detecting the output difference, an electric signal applied to the metal pin 1a can be measured.

The change of the polarizing state of the electro-optic element caused by the change of the voltage applied to the measuring point can be detected as the difference of the polarizing state between two photodiodes 12 and 14. Thus, the electric signal applied to the metal pin 1a can be measured by detecting the output difference.

Since the EOS oscilloscope shown in FIG. 2 usually detects the change of refractive index of the elctro-optic element, it is preferable to eliminate other factors affecting on the change of the refractive index of the electro-optic element in addition to the voltage applied to the metal pin 1a, because such factors will cause errors in the test measurement.

However, there is a problem that if the temperature of the electro-optic element changes, the refractive index of the electro-optic element changes so that accurate measurements cannot be made.

It might be possible to carry out measurement by compensating the temperature change in signal processing, but another problem that arises is that the temperature dependence of the electro-optic element is nonlinear.

SUMMARY OF THE INVENTION

It is therefore the object of the present invention to provide an electro-optic probe for EOS sampling oscilloscope which is capable of improving the accuracy of the measurement by maintaining the temperature of the electro-optic element at constant.

According to the first aspect of the present invention, there is provided a probe for an electro-optic sampling oscilloscope comprising: a laser diode for emitting a laser beam based on a control pulse signal of a body of the electro-optic sampling oscilloscope; a collimating lens for collimating said laser beam; an electro-optic element having a reflecting film at one end and the optical property thereof that change due to an electric field propagated through a metal pin provided at the end surface on the reflecting film side; an isolator, provided between said collimate lens and said electro-optic element, for separating the laser beam reflected by said reflecting film after passing the laser beam emitted by said laser diode; and photodiodes for converting the reflected light separated by said isolator into electric signals; wherein, the probe for the electro-optic sampling oscilloscope further comprises: a temperature detecting portion disposed so as to abut said electro-optic element for detecting and outputting a temperature of the electro-optic element; a temperature adjusting portion, disposed so as to face said temperature detecting portion abutting said electro-optic element, for adjusting the temperature of said electro-optic element in response to the detected temperature; and a temperature controlling portion for controlling said temperature adjusting portion based on said detected temperature.

According to the second aspect of the present invention, in a probe for an electro-optic sampling oscilloscope according to the first aspect, said temperature detecting portion is formed by a thermister and the temperature of said electro-optic element is detected by the change of the resistance.

According to the third aspect, in a probe for an electro-optic sampling oscilloscope according to the second aspect, said temperature adjusting portion is formed by a heater, and the temperature of said electro-optic element is increased by changing the electric current flowing in said heater.

According to the fourth aspect, in a probe for an electro-optic sampling oscilloscope according to the first aspect, said temperature adjusting portion is formed by a Peltier element and the temperature of the electro-optic element is increased or decreased by changing the current flowing in said Peltier element.

According to the fifth aspect, in a probe for an electro-optic sampling oscilloscope according to the first aspect, said temperature controlling portion controls the temperature adjusting portion based on the detected results of said temperature detecting portion such that the temperature of said electro-optic element is maintained at a temperature where the temperature characteristic of said electro-optic element is excellent.

DETAILED DESCRIPTION OF THE INVENTION

A electro-optic probe for an EOS sampling oscilloscope according to preferred embodiment of the present invention will be described with reference to attached drawings.

Figure 1:
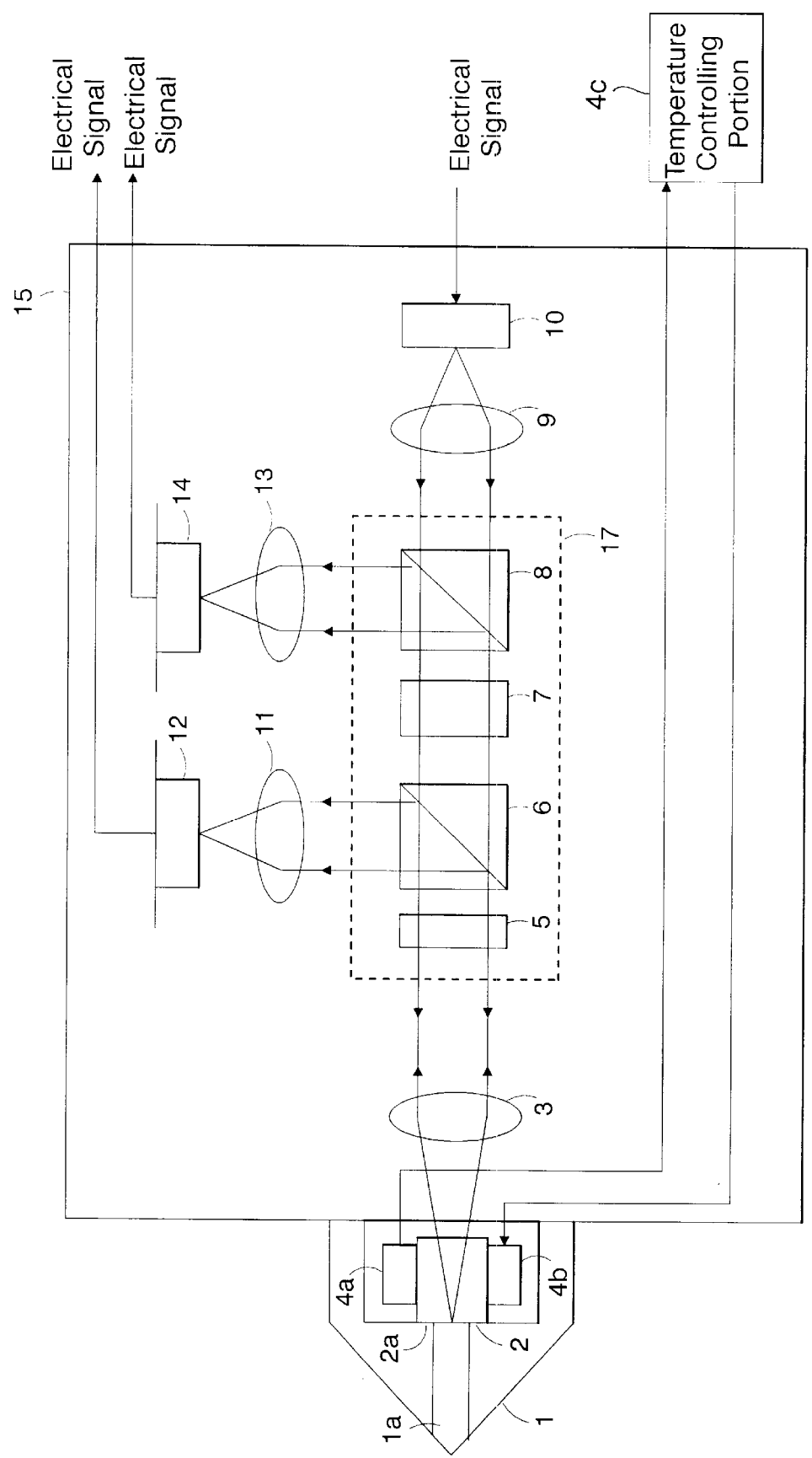
FIG. 1 is a structural diagram showing an optical system according to preferred embodiment of the present invention.
Figure 2:
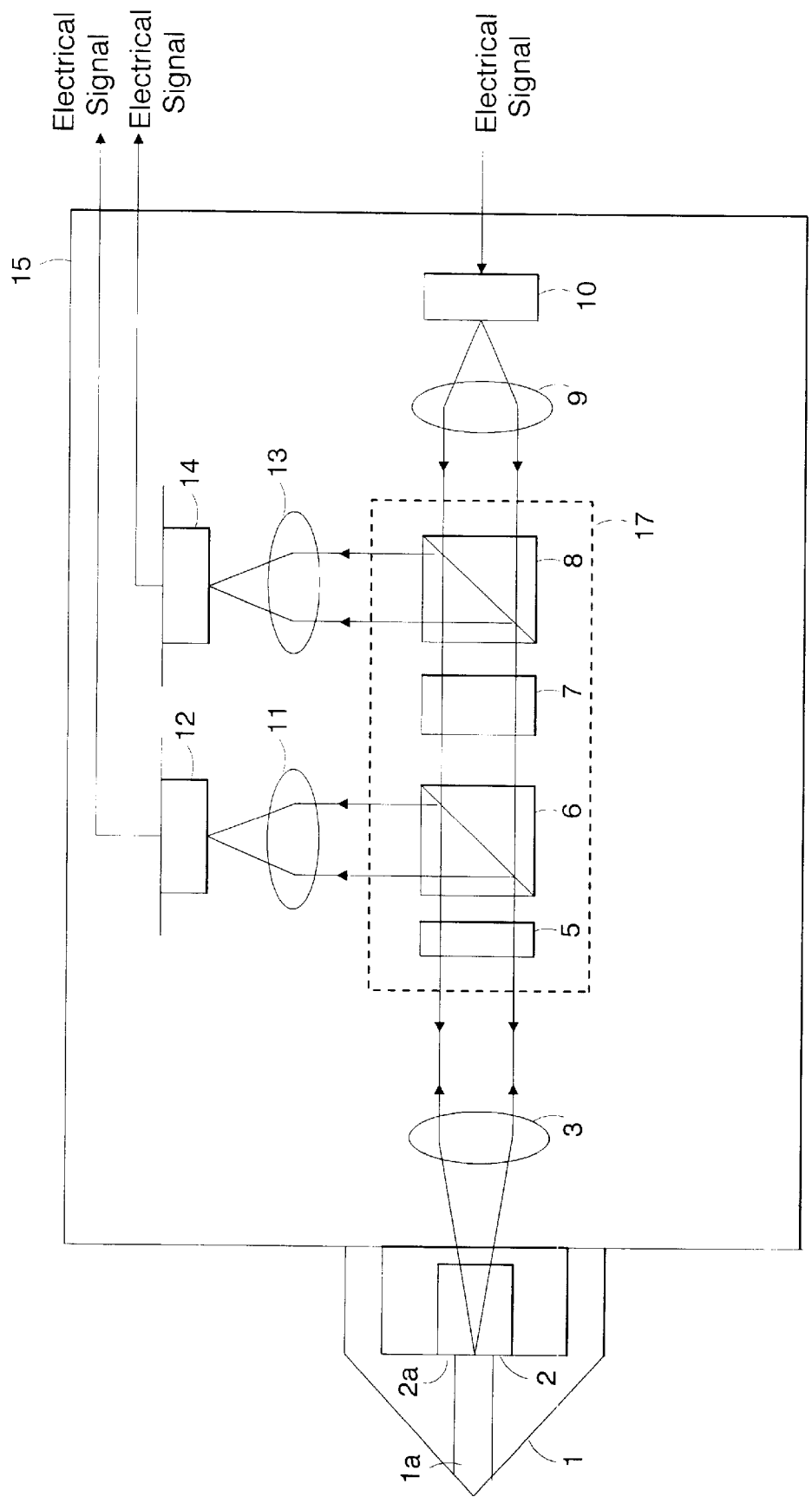
FIG. 2 is a structural diagram showing an optical system of an electro-optic probe for a conventional oscilloscope.

FIG. 1 is a structural diagram showing an optical system according to a preferred embodiment of the present invention. In FIG. 1, the same components as those in the conventional example shown in FIG. 2 are denoted by the same numerals and explanations are omitted. The elecro-optic probe shown in FIG. 1 differs from the conventional probe in that the present electro-optic probe provides a temperature detecting portion 4a and a temperature adjusting portion 4b so as to contact with the electro-optic probe, and a temperature controlling portion 4c at the outside of the electro-optic probe for the EOS sampling oscilloscope.

The temperature detecting portion 4a is constituted by, for example, a thermister, and is fixed on the probe head 1, as being abutted with the electro-optic element. The temperature adjusting portion 4b is constructed by, for example, a Peltier element, and is fixed on the probe head 1, so as to be abutted with the electro-optic element. The temperature adjusting portion 4b, however, is disposed on the surface of the electro-optic element 2 such that it is disposed at the remotest position from that of the temperature detecting portion 4a. For example, when the electro-optic element 2 is in a form of a cylinder, then both temperature detecting portion and the adjusting portion 4a and 4b are disposed so as to face each other about the center of the circle.

Thereby, when a heating or a cooling operation is carried out by the temperature adjusting portion 4b abutting with the electro-optic element 2, the heat propagates in the electro-optic element 2 by thermal conduction, so that the temperature detected by the temperature detecting portion 4a is close to the temperature of the electro-optic element 2 and the temperature detected by the temperature detecting portion 4a plays an important role in controlling the temerature of the electro-optic element 2 so as to remain constant.

In addition, the temperature detecting portion 4a and the temperature adjusting portion 4b are connected with the controlling portion 4c disposed at the outside of the electro-optic probe body 15.

Next, an operation for maintaining the temperature of the electro-optic element 2 at a constant is described. First, the temperature controlling portion 4c stores in advance a temperature having a temperature characteristic most appropriate for the electro-optic element 2. This temperature characteristic described above is a characteristic showing a temperature dependence of the refractive index of the electro-optic element 2. In addition the most appropriate temperature for the temperature characteristic means that at that temperature, the variation of the refractive index by the temperature change is the smallest. Here, the most appropriate temperature is set 20° C., and hereinafter this temperature is called the target temperature.

As described above, since the temperature detecting portion 4a is in contact with the electro-optic element 2, the temperature detecting portion 4a detects the same temperature as that of the electro-optic element 2. Therefore, the output of the temperature detecting portion 4a corresponds to the detected temperature of the electro-optic element 2. The temperature controlling portion 4c receives the detected temperature and compares the detected temperature with the target temperature. If there is a difference between the detected temperature and the target temperature, then the temperature of the electro-optic element 2 is adjusted by the temperature adjusting portion 4b.

If the detected temperature is lower than the target temperature, the temperature controlling portion 4c controls the current to the temperature adjusting portion 4b so as to raise the temperature of the temperature adjusting portion 4b. The increased current to the temperature adjusting portion 4b generates heat by the Peltier effect, and this heat propagates into the electro-optic element by thermal conduction. Thereby, the temperature of the electro-optic element 2 increases.

In contrast, if the detected temperature is higher than the target temperature, the temperature controlling portion 4c controls the electric current to the temperature adjusting portion 4b for lowering the temperature of the temperature adjusting portion 4b. Thus, the temperature adjusting portion 4b absorbs heat by the Peltier effect, and as a result, the temperature of the temperature adjusting portion decreases. Since the electro-optic device is in contact with the temperature adjusting portion 4b, the heat of the electro-optic element 2 is absorbed so that the temperature of the electro-optic element 2 decreases.

The temperature controlling portion 4c has the function of maintaining the temperature of the electro-optic element 2 at a constant by repeating the above described current controlling operations. Since the measuring operation of the test measuring signals is carried out identically with the conventional technique, the explanation is omitted.

As shown above, the temperature of the electro-optic element 2 is controlled so as to be maintained at the optimum temperature, the test measuring signals can be measured accurately.

Here, the temperature adjusting portion 4b can be formed using only a heat source such as a heater, without the Peltier element. In such a case, the electro-optic element 2 is cooled by self-cooling for lowering the temperature. Thus, the target temperature for such a structure formed only by a heat source such as the heater is set at a higher temperature than the room temperature in which the probe is used.

It may be possible for the temperature controlling portion 4c to display the temperature of the electro-optic element 2 based on the result of the temperature detecting portion 4a. The operator may be carry out an appropriate operation by referring to the displayed temperature of the electro-optic element 2. A display device for showing the temperature of the electro-optic element 2 only having a heater for heating the element allows taking an appropriate measure so as to suspend the measurement until the temperature decreases.

Another alternative is provision of the temperature controlling portion 4c with the input device such as a keyboard for controlling the electro-optic element 2 at a desirable temperature by an operator. Furthermore, still other alternative is to integrate the heat controlling portion 4c in the EOS oscilloscope body.

Furthermore, the other alternative for the temperature control of the probe as a whole is provision of the probe head and probe body by a material with superior conductivity and disposition of the Peltier element so as to abut with both of the probe head and the probe body.

As described above, the present invention exhibits an effect that, since the present invention provides a temperature detecting portion so as to contact with the electro-optic element and a temperature controlling portion for controlling the temperature of the electro-optic element based on the result of detection by the temperature detecting portion, the electro-optic element can be maintained at a constant temperature which results in preventing the change of the refractive index due to the temperature change. The above effect contributes to improving the accuracy of the measurement.

Furthermore, another effect is obtained that, since the temperature controlling portion is disposed on the surface of the electro-optic element at the most remote position from the temperature detecting portion, and since the temperature adjusting portion 4b in contact with the electro-optic element generates heat which conducts in the electro-optic element, the temperature, detected by the temperature detecting portion disposed at the opposite position facing the temperature adjusting portion is very close to the temperature of the electro-optic element which results in improving the accuracy in detecting the temperature of the electro-optic element. Consequently, the above effect allows the electro-optic element to be maintained at the optimum temperature at which the best temperature characteristic of the electro-optic element is obtained.

What is claimed is:

1. A probe for an electro-optic sampling oscilloscope comprising:

a laser diode for emitting a laser beam based on a control pulse signal of the electro-optic sampling oscilloscope;

a collimating lens for collimating said laser beam;

an electro-optic element having a reflecting film at one end and having an optical property thereof that changes due to an electric field propagated through a metal pin provided at one surface on the reflecting film;

an isolator between said collimating lens and said electro-optic element for separating the laser beam reflected by said reflecting film after passing the laser beam emitted by said laser diode; and photodiodes for converting the reflected light separated by said isolator into electric signals;

wherein, the probe for the electro-optic sampling oscilloscope further comprises:

a temperature detecting element in contact with said electro-optic element for detecting and outputting a temperature of said electro-optic element;

a temperature adjusting element in contact with said electro-optic element, for adjusting the temperature of said electro-optic element in response to the detected temperature;

and a temperature controlling means for controlling said temperature adjusting element based on said detected temperature.

2. A probe for an electro-optic sampling oscilloscope according to claim 1, wherein said temperature detecting element comprises a thermistor and the temperature of said electro-optic element is detected by the change of the resistance of said thermistor.

3. A probe for an electro-optic sampling oscilloscope according to claim 2, wherein said temperature adjusting element comprises a heater means and the temperature of said electro-optic element is changed by said temperature controlling means changing the electric current flowing in said heater means.

4. A probe for an electro-optic sampling oscilloscope according to claim 1, wherein said temperature adjusting element comprises a Peltier element and the temperature of said electro-optic element is changed by said temperature controlling means changing the current flowing in said Peltier element.

5. A probe for an electro-optic sampling oscilloscope according to claim 1, wherein said temperature controlling means controls said temperature adjusting element based on the detected results of said temperature detecting element such that the temperature of said electro-optic element is maintained at a predetermined temperature.

6. A probe for an electro-optic sampling oscilloscope according to claim 1 wherein said temperature sensing element faces said temperature adjusting element when contacting said electro-optic element.

* * * * *